United States Patent [19]
Bassen et al.

[11] 4,070,621
[45] Jan. 24, 1978

[54] ANTENNA WITH ELECTRO-OPTICAL MODULATOR

[75] Inventors: Howard I. Bassen, North Chevy Chase; Richard Peterson, Rockville, both of Md.

[73] Assignee: The United States of America as represented by the Department of Health, Education and Welfare, Washington, D.C.

[21] Appl. No.: 708,008

[22] Filed: July 23, 1976

[51] Int. Cl.$^2$ ............................................. G01R 31/00
[52] U.S. Cl. .................................... 324/96; 324/95; 325/67; 325/133; 325/363; 350/151; 350/157; 343/703; 250/199
[58] Field of Search ............................ 324/96, 97, 95; 350/151, 157; 325/67, 133, 363; 343/703, 854; 250/199, 233

[56] References Cited

U.S. PATENT DOCUMENTS

| | | | |
|---|---|---|---|
| 3,327,121 | 6/1967 | Thomas | 250/199 |
| 3,331,036 | 7/1967 | Colbow | 250/199 X |
| 3,403,257 | 9/1968 | Petroff | 250/199 |
| 3,414,728 | 12/1968 | Patel | 250/199 |
| 3,492,492 | 1/1970 | Ballman et al. | 250/199 X |
| 3,614,451 | 10/1971 | Gunn | 324/96 X |
| 3,622,790 | 11/1971 | Zavodny | 250/199 |
| 3,750,017 | 7/1973 | Bowman | 324/72 |
| 3,989,352 | 11/1976 | Lacklison et al. | 350/157 X |

FOREIGN PATENT DOCUMENTS

| | | | |
|---|---|---|---|
| 2,354,668 | 5/1975 | Germany | 343/854 |

*Primary Examiner*—Stanley T. Krawczewicz
*Attorney, Agent, or Firm*—Holman & Stern

[57] ABSTRACT

A wideband, passive detector of electromagnetic fields in free space is disclosed. The apparatus is especially designed to minimize amplitude perturbations of the electromagnetic field being monitored. The apparatus includes an electro-optic modulator having first and second surfaces with electrodes attached thereto and a third and fourth surfaces intersecting an optical path. An electrically small dipole or loop antenna has a first electrode connected to the first electrode of the modulator and a second electrode connected to the second electrode of the modulator, for converting electromagnetic fields intercepted in free space to a voltage signal to be applied to the first and second electrodes of the modulator. A loading resistor may be added in parallel with the electrodes to improve system bandwidth. A light source is located along the optical path, for transmitting light into the modulator through the third surface. The modulator modulates the light entering through the third surface, as it traverses the modulator, with the voltage signal impressed upon the first and second surfaces by the antenna means. An optical detector is located along the optical path for detecting the modulated light along the optical path as it exits from the modulator through the fourth surface. In this manner, weak electromagnetic fields may be detected and their amplitude, phase and frequency measured with a minimal perturbation due to a lack of metallic wires attached to the antenna as in conventional field measurement systems.

17 Claims, 3 Drawing Figures

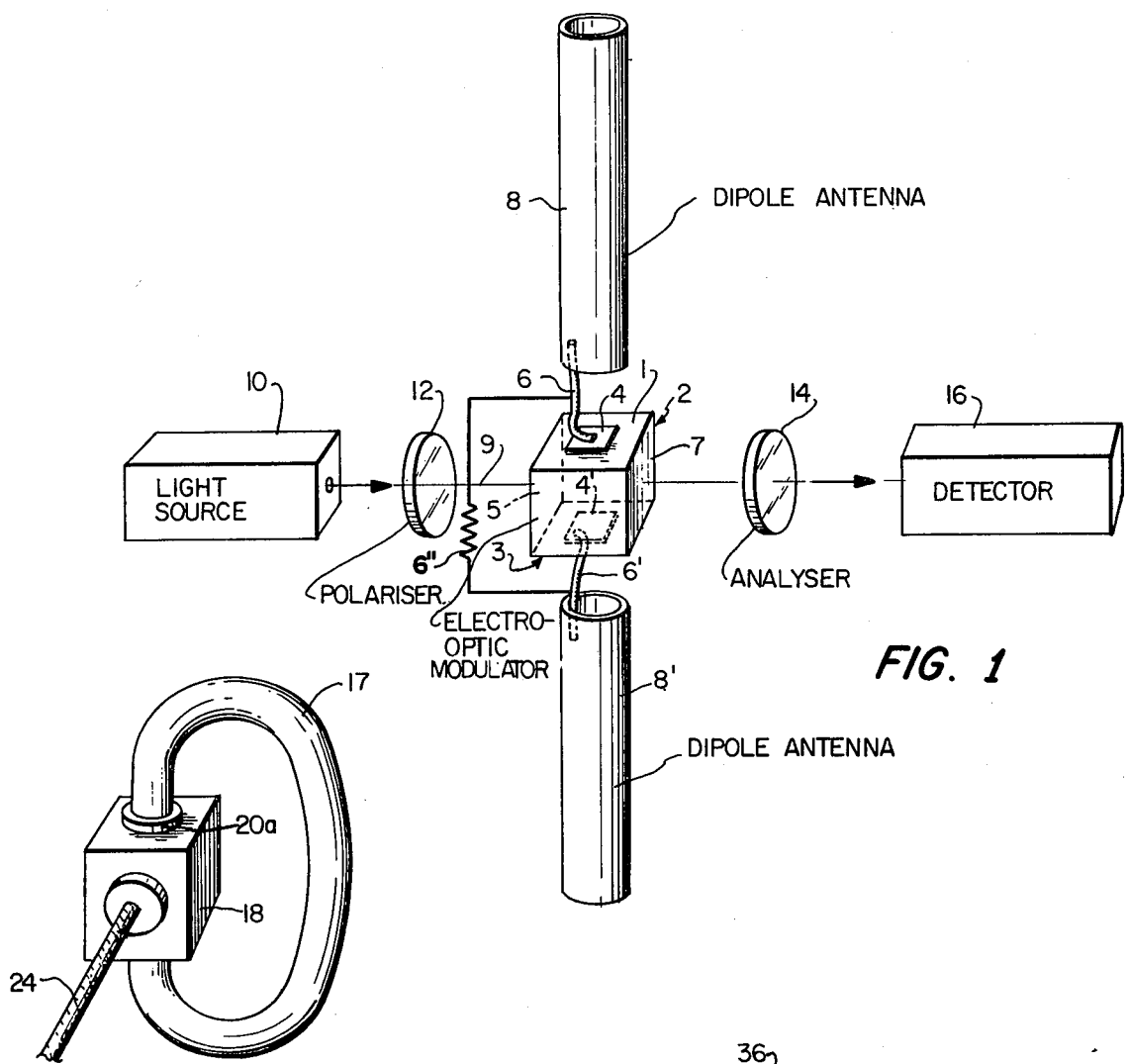
FIG. 1
FIG. 2
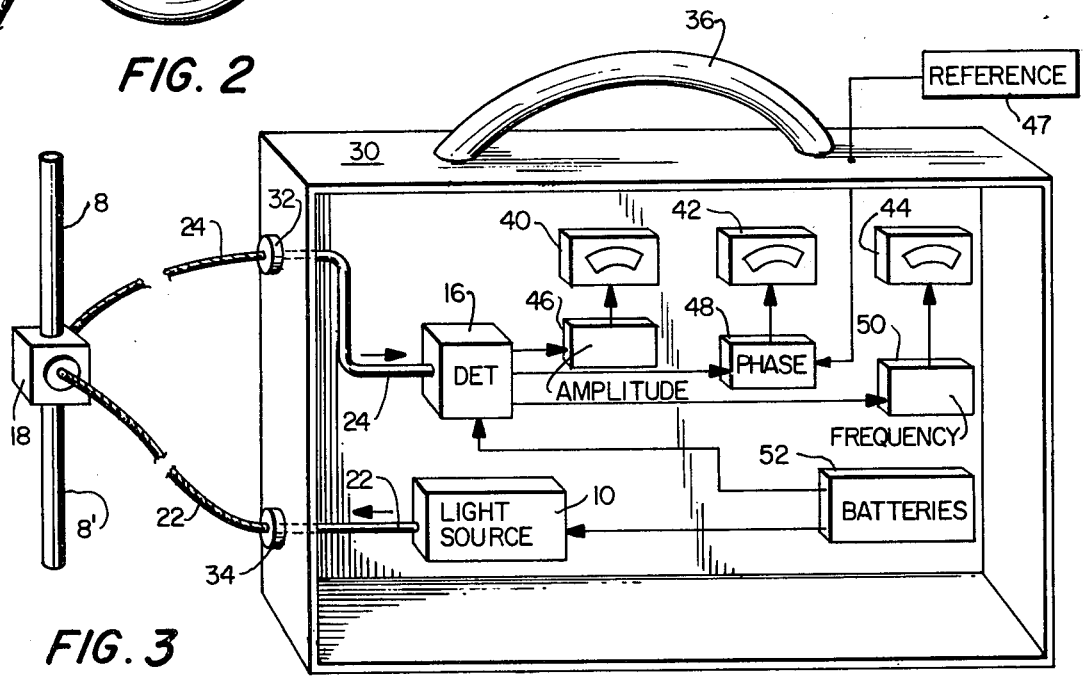
FIG. 3

ANTENNA WITH ELECTRO-OPTICAL MODULATOR

FIELD OF THE INVENTION

The invention disclosed generally relates to electromagnetic field measuring devices and more particularly relates to a portable field instrument for the measurement of hazardous electromagnetic fields.

BACKGROUND OF THE INVENTION

The detection and measurement of hazardous electromagnetic radiation which may pose a biological threat has become increasingly more important in view of the rapid proliferation of electronic appliances such as micro-wave ovens, marine radar systems, medical apparatus such as diathermy equipment, and the like. Recently, both state and federal agencies have promulgated criteria for maximum electromagnetic radiation exposure in the vicinity of domestic and commercial RF and microwave appliances. Accurate monitoring of such appliances requires that the introduction of the monitoring apparatus into the vicinity of the appliance does not result in a significant perturbation of the electromagnetic field to be measured, and a consequent loading of the radiation source. In addition, short duration bursts of radiation from devices such as radar systems must be detectable, requiring a measurement system with a relatively large bandwidth. Furthermore, the relatively small maximum permissable radiation exposure safety levels require a detector capable of measuring small field strengths. The capacity of the detector to identify the polarization of the source of prohibited electromagnetic radiation is also important.

Prior art electromagnetic field measurement devices have utilized metallic cables, which tend to perturb the field being monitored, reducing the accuracy of the resulting measurements. A more recent field measurement system employs diode detectors connected to an antenna, to detect electromagnetic radiation. The diode detector employs a high-ohmic transmission line to transfer the detected signal to a readout device which allows extraneous noise to be picked up by the antenna. The bandwidth of the information transmitted on the high-ohmic transmission line is quite small, precluding the observation of short electromagnetic pulses or rapid modulation of the fields under study. Light emitting diodes connected to an antenna are impractical for the measurement of fields whose strengths even approach the small magnitude required to enforce the maximum radiation exposure criteria. The prior art light emitting diode is an active device, drawing its power from the field being monitored. Approximately 1.3 volts must be applied to the light emitting diode before any light is emitted whatsoever. However, only a few millivolts of radio-frequency or micro-wave energy are available from an electrically small, non-perturbing antenna in the presence of an electric field whose intensity is strong enough to just exceed the radiation exposure hazard criteria for RF or micro-wave appliances. In addition, the prior art light emitting diode device distorts the instantaneous signal which is received by the antenna to which it is connected, thereby reducing the accuracy of the measurement of the amplitude, phase and frequency thereof.

A need therefore exists for an electromagnetic field measuring device which provides a long-sought solution to the problem of accurately measuring the amplitude, phase and frequency of hazardous electromagnetic radiation whose magnitude is in the range of the permissable radiation exposure criteria.

It is therefore an object of the invention to monitor electromagnetic radiation in free space or in the near field of a radiating source in an improved manner, including amplitude phase and frequency.

It is still another object of the invention to monitor electromagnetic radiation in free space or in the near field of a radiation source without introducing perturbations to the field being monitored, in an improved manner.

It is still a further object of the invention to monitor electromagnetic radiation in free space or in the near field of a radiating source which appears as a short duration burst or a rapid modulation, in an improved manner.

It is still a further object of the invention to monitor electromagnetic radiation in free space or in the near field of a radiating source so as to determine the polorization of the fields, in an improved manner.

It is yet another object of the invention to monitor electromagnetic radiation having a small field strength (either electric or magnetic fields), in an improved manner.

It is a further object of the invention to provide an improved, portable and accurate electromagnetic field measuring device having a probe of such design as to cause minimal perturbation of the field, permitting field strength measurements at a physical location close to the field source without loading the field source.

Still further objects of the invention particularly appropriate for its use as a portable measuring instrument concern the provision of an improved electromagnetic field measuring device which is stable in operation, immune to burnout, rugged, lightweight, physically small, and capable of operation by a self-contained power source.

SUMMARY OF THE INVENTION

These objects, as well as others which will become apparent as the description proceeds, are implemented by the instant antenna with electro-optical modulator. The invention is a wideband, passive detector of electromagnetic fields in free space. It includes an electro-optic modulator, such as a crystal having a first and second surfaces with electrodes attached thereto, and a third and fourth surfaces intersecting an optical path. An antenna means consisting of a dipole or loop antenna (electrically short) having a first electrode connected to the first electrode of the modulator and the second electrode is connected to the second electrode of the modulator, for converting electromagnetic fields intercepted, to a voltage signal to be applied to the first and second electrodes of the modulator. A resistor may be placed in parallel with the electrodes to improve system bandwidth. A light source is located along the optical path for transmitting light into the modulator through the third surface. The modulator modulates the light entering through the third surface, as it traverses the modulator, with the voltage signal impressed upon the first and second surfaces by the antenna means. A detector means located along the optical path detects the modulated light along the optical path as it exists from the modulator through the fourth surface. In this manner, weak electromagnetic fields may be detected in free space with a negligible perturbation thereto, with the intensity of light passing from the analyzer to the detector varying in response to the oscillation of the electromagnetic field intercepted by the antenna.

DESCRIPTION OF THE FIGURES

These and other objects, features and advantages will be more fully appreciated with reference to the accompanying drawings wherein:

FIG. 1 is a perspective schematic view of the basic elements of the electro-optical modulator;

FIG. 2 is a perspective view illustrating the electro-optical modulator combined with a loop antenna; and FIG. 3 is a block diagram of the electro-optical modulator in conjunction with processing circuitry.

DETAILED DISCUSSION OF THE PREFERRED EMBODIMENT

Referring now to the drawings and in particular FIG. 1, the basic elements necessary to the operation of the invention are shown. FIG. 1 shows the wideband, passive detector of electromagnetic fields in free space which operates with a negligible perturbation upon those fields. FIG. 1 shows the electro-optic crystal 2 which is generally in the shape of a parallelepiped. A first surface 1 and a second surface 3 have electrodes 4 and 4', respectively, attached thereto. A third surface 5 and fourth surface 7 intersect the optical path 9. An antenna means 8, 8' has a first electrode 6 connected to the first electrode 4 of the crystal 2 and a second electrode 6' connected to the second electrode 4' of the crystal 2. The antenna converts electromagnetic fields intercepted in free space, to a voltage signal to be applied to the first electrode 4 and second electrode 4' of the crystal 2.

A light source 10 is located along the optical path 9, for transmitting light to the crystal 2 through the third surface 5 of the crystal. The crystal 2 modulates the light entering through the third surface 5, as it traverses the crystal 2, with the voltage signal impressed on the first surface 1 and the second surface 3 by the antenna means 8, 8'.

A detector means 16 is located along the optical path for detecting the modulated light along the optical path as it exits from the crystal 2 through the fourth surface 7. In operation, the instrument detects weak electromagnetic fields in free space while imposing a negligible perturbation thereon.

Also shown in FIG. 1 is a polarizer means 12 located along the optical path 9 between the light source 10 and the crystal 2. The polarizer means polarizes the light transmitted to the third surface 5 of the crystal 2 from the light source 10.

The modulation of the light in the crystal 2 is an electrically induced birefringence. The state of polarization of the light being transmitted through the crystal 2, is altered according to the electrical field intensity to which the crystal 2 is subjected by the voltage signal applied to the electrodes 4 and 4'.

An analyzer means 14 is located along the optical path 9 between the crystal 2 and the detector means 16. The analyzer means transmits the component of the modulated light, lying in a preferred direction. In this manner, the intensity of the light passing from the analyzer 14 to the detector 16 varies in response to the oscillation of the electromagnetic field intercepted by the antenna 8, 8'.

The theory of the electro-optic modulation has been extensively discussed in the literature, for example F. S. Chen, "Modulators for Optical Communications", proceedings of the IEEE, Vol. 58 No. 10, October 1970, pages 1440–1457. The literature discusses the electro-optic properties of a number of different materials and modulator configurations employing electro-optic crystals. Suitable electro-optic materials for the composition of the crystal 2 may be selected from the group consisting of $LiNbO_3$, $LiTaO_3$, $KD_2PO_4$ (DKDP), $Ba_2NaNb_5O_{15}$, $Sr_{0.25}Ba_{0.75}Nb_2O_6$, $BaTiO_3$, GaAs and CdTe. These materials are useful at most optical wavelengths, except for GaAs and CdTe which are useful at 10.6 microns.

These electro-optic materials have the common property that they enter into a state of birefringence which is proportional to the magnitude of the field strength imposed across the crystal. When polarized light propagates through the crystal, it undergoes a rotation in a direction of polarization which is proportional to the distance traversed in the crystal and the magnitude of the birefringent state. By polarizing light prior to entry into the crystal and analyzing the polarized light after it propagates through the crystal and undergoes a rotation of its polarization direction, by means of a second analyzer polarizing element, the extent of the rotation of the plane of polarization due to the birefringent state can be measured. This phenomenon, known as the pockels effect, is well described in the literature.

The antenna 8, 8' may be either a dipole antenna as is shown in FIG. 1 or alternatively, a loop antenna as is shown in FIG. 2. The length of the dipole antenna should be short with respect to the wave length of the radiation to be detected. When the dipole antenna is excited by ambient electromagnetic fields, a voltage is impressed upon the electrodes 4 and 4' which in turn, imposes an electric field across the crystal 2. The inclusion of a resistor 6'' placed across the electrodes 4 and 4' will serve to modify the bandwidth of the system.

The light source 10 may be any conventional light source but is preferably a monochromatic light source so as to reduce the amount of chromatic dispersion in the optical elements. A preferred light source is a laser such as a helium-neon laser. A helium-neon laser having a power of approximately 4mw is sufficient for use with a 20mm × 1mm × 1mm crystal of $LiNbO_3$.

The detector means 16 may be any suitable optical detector. In particular, a PIN photo-diode, optical detector has been found to be suitable in this application.

FIG. 2 illustrates the electro-optical modulator in combination with a loop antenna 17 which is an alternative embodiment of the invention. In the loop antenna the magnetic component of the electromagnetic field induces a corresponding voltage across the electrodes 4 and 4', similar to the action of the dipole antenna in the electric component of the electromagnetic field.

FIG. 3 illustrates in block diagram form, some of the signal processing circuitry which may be used with the detector 16. An amplitude signal measuring circuit 46 has an input connected to the detector 16 and an output connected to an amplitude meter 40 mounted on the case 30. A phase signal measuring circuit 48, with a reference signal input 47 is shown having an input connected to the detector means 16 and output connected to a phase meter 42. A frequency counter 50 is shown having an input connected to detector 16 and an output connected to a frequency meter 44.

To enable the instrument to be easily portable to remote areas where electromagnetic field monitoring is to take place, a self-contained power source 52 is enclosed in the case 30 and is connected to the light source 10 and the detector 16 and to the amplitude measuring system 46, the phase measuring system 48 and the frequency counter 50. Optical fiber bundles 22 and 24 carry light from light source 10 to electro-optic crystal 18 and from crystal 18 to detector 16.

A specific example of the claimed invention may be constructed and its measurement properties demonstrated as follows. An electrically short (30cm) dipole antenna 8 and 8' may be attached to the electrodes 4 and 4' of a lithium niobate crystal 2 having the dimensions of 20mm × 1mm × 1mm. To test the probe, a 10 volt per meter electric field may be generated in a parallel plate transmission line and used to irradiate the probe. The frequency of the field may then be swept from 10 to 30 megaHertz while the crystal is interrogated by a polarized 4mW helium-neon laser beam. A wideband PIN photodiode optical detector and polarizing filter may be used to convert the modulated emergent laser beam into an electrical signal which may then be measured by a commercial spectrum analyzer. Performance tests upon the invention have resulted in the observation of a 10db signal to noise ratio over the 10 to 30 megaHertz band in a 3 kiloHertz IF bandwidth for the spectrum analyzer. The frequency response was observed to be flat within plus or minus 2db over the band and harmonic distortion went below minus 20db for a 200 volt per meter field. Linearity of plus or minus 0.2db was observed over a 33db range.

The resulting detector provides a highly accurate measurement of low field strength electromagnetic radiation without causing a perturbation of the field, by virtue of the high impedance characteristics of the detector and the absence of extraneous metallic objects in the vicinity of the probe. The resulting detector is a passive device, drawing a negligible amount of power from the field under study and providing excellent sensitivity. As is obvious to those skilled in the art, many modifications and improvements to the above embodiment are possible in light of the teachings contained herein and the invention is only limited by the scope of the appended claims.

What is claimed is:

1. A wideband, passive detector of electromagnetic fields comprising:
    an electro-optic modulator having first and second surfaces with electrodes attached thereto and third and fourth surfaces intersecting an optical path;
    an antenna means having a first electrode connected to said first electrode of said modulator and a second electrode connected to said second electrode of said modulator for converting electromagnetic fields intercepted to a voltage signal to be applied to said first and second electrodes of said modulator;
    a light source located above said optical path, for transmitting light into said modulator through said third surface;
    said modulator modulating the light entering through said third surface, as it traverses said modulator, with said voltage signal impressed upon said first and second surfaces by said antenna means; and
    a detector means located along said optical path for detecting said modulated light along said optical path as it exits from said modulator through said fourth surface whereby weak electromagnetic fields may be detected in free space with a negligible perturbation.

2. The apparatus of claim 1 wherein said modulator is an electro-optical crystal.

3. The apparatus of claim 2, which further comprises:
    a polarizer means located along said optical path between said light source and said crystal, for polarizing said light transmitted to said third surface of said crystal;
    said modulation of said light in said crystal being an electrically induced birefringence, the state of polarization of said light being altered according to the electrical field intensity to which the crystal is subjected by said voltage signal;
    an analyzer means located along said optical path between said crystal and said detector means, for transmitting the component of said modulated light, lying in a preferred direction; and
    whereby the intensity of the light passing from said analyzer means to said detector means varies in response to the instantaneous voltage of the electromagnetic field intercepted by said antenna means.

4. The apparatus of claim 2, wherein said crystal is composed of material selected from the group consisting of $LiNbO_3$, $LiTaO_3$, $KD_2PO_4$ (DKDP), $Ba_2NaNb_5O_{15}$, $Sr_{0.25}Ba_{0.75}Nb_2O_6$, GaAs and CdTe.

5. The apparatus of claim 1, wherein said antenna means is a dipole antenna.

6. The apparatus of claim 5, wherein said dipole antenna is short compared to the wavelength of the electromagnetic field to be detected.

7. The apparatus of claim 1, wherein said antenna is a loop antenna.

8. The apparatus of claim 7, wherein said loop antenna is electrically small compared to the wavelength of the electromagnetic field to be detected.

9. The apparatus of claim 1, wherein said light source is a laser.

10. The apparatus of claim 9, wherein said laser is a helium-neon laser.

11. The apparatus of claim 1, which further comprises an optical fiber located between said light source and said modulator, for transmitting said light from said light source.

12. The apparatus of claim 1, which further comprises:
    an optical fiber located between said crystal and said detector, for transmitting said modulated light to said detector.

13. The apparatus of claim 1, wherein:
    said antenna means is a dipole antenna 30cm in length;
    said modulator is a 20mm × 1mm × 1mm crystal of lithium niobate;
    said light source is a 4mW helium-neon laser;
    and said detector means is a PIN photodiode optical detector.

14. The apparatus of claim 3, which further comprises:
    a first optical fiber located between said light source and said polarizer means, for guiding said light from said light source to said polarizer means;
    a second optical fiber located between said analyser means and said detector means, for guiding said modulated light from said analyser means to said detector means.

15. The apparatus of claim 1 wherein said modulator includes a resistor connected across said first and second surface electrodes to modify system bandwidth.

16. The apparatus of claim 1 where the modulator comprises an integrated optical modulator of the electro-optical type.

17. The apparatus of claim 6 where the modulator comprises a integrated optical modulator of the electro-optical type and a parallel resistor.

* * * * *